US007084552B2

(12) United States Patent
Bhardwaj

(10) Patent No.: US 7,084,552 B2
(45) Date of Patent: Aug. 1, 2006

(54) ANISOTROPIC ACOUSTIC IMPEDANCE MATCHING MATERIAL

(75) Inventor: Mahesh C. Bhardwaj, State College, PA (US)

(73) Assignee: The Ultran Group, Inc., State College, PA (US)

( * ) Notice: Subject to any disclaimer, the term of this patent is extended or adjusted under 35 U.S.C. 154(b) by 147 days.

(21) Appl. No.: 10/758,782

(22) Filed: Jan. 15, 2004

(65) Prior Publication Data

US 2004/0174095 A1 Sep. 9, 2004

Related U.S. Application Data

(60) Provisional application No. 60/440,660, filed on Jan. 16, 2003.

(51) Int. Cl.
*H01L 41/08* (2006.01)

(52) U.S. Cl. ...................................................... 310/327

(58) Field of Classification Search ................ 310/326, 310/327

See application file for complete search history.

(56) References Cited

U.S. PATENT DOCUMENTS

| | | | | |
|---|---|---|---|---|
| 3,794,866 | A * | 2/1974 | McElroy et al. | 310/327 |
| 5,343,443 | A * | 8/1994 | Merewether | 367/152 |
| 5,648,941 | A | 7/1997 | King | |
| 6,051,913 | A | 4/2000 | King | |
| 6,311,573 | B1 | 11/2001 | Bhardwaj | |
| 6,467,138 | B1 * | 10/2002 | Aime | 29/25.35 |
| 6,545,947 | B1 | 4/2003 | Morozumi et al. | |
| 2004/0032188 | A1 | 2/2004 | Bhardwaj | |
| 2005/0275313 | A1 * | 12/2005 | Yamashita et al. | 310/327 |

FOREIGN PATENT DOCUMENTS

| | | | |
|---|---|---|---|
| JP | 11-155857 | * | 6/1999 |
| WO | WO 01/37609 A1 | | 5/2001 |

* cited by examiner

*Primary Examiner*—Thomas M. Dougherty
(74) *Attorney, Agent, or Firm*—The Webb Law Firm

(57) ABSTRACT

A piezoelectric transducer comprises a piezoelectric layer and an adjacent layer of an acoustic impedance matching material having a plane face comprising a homogenous matrix material with embedded fibers, clusters of fibers, or rods of another material oriented perpendicular to the plane face.

6 Claims, 4 Drawing Sheets

ANISOTROPIC ACOUSTIC IMPEDANCE MATCHING MATERIAL

RELATED APPLICATION

This application claims priority to U.S. Provisional Patent Application No. 60/440,660, filed Jan. 16, 2003 and incorporates that application by reference.

BACKGROUND OF THE INVENTION

For ultrasonic transducer devices, specifically for those that are based upon solid piezoelectric (SP) materials, such as solid lead zirconate-lead titanate (PZT) and polymer matrix piezoelectric (PMP) materials, it is imperative to install or bond acoustic impedance matching (Z matching) layers on the piezoelectric materials in order to optimize the ultrasound transduction into the medium of propagation. See, for example, U.S. Pat. No. 6,311,573 incorporated herein by reference, and U.S. patent application Ser. No. 10/357,531 entitled "Piezoelectric Transducer With Gas Matrix", filed Jan. 7, 2003. Current transducer devices utilize relatively low Z matching layers on the PZT or PMP transducers in order to achieve high transduction into low Z materials, such as water, tissue, polymers, etc. Similarly, relatively high Z matching layers are used to achieve high transduction in high Z materials, such as metals, ceramics, and their composites. This mechanism of Z matching significantly increases the efficiency of transmission of ultrasound in a given medium of propagation. However, utilization of current Z matching layers permits acoustical crosstalk between two closely lying transducers, as in the case of linear, phased, or matrix arrays. Crosstalk between two transducers that are physically connected to each other is the consequence of strong planar coupling of the piezoelectric materials. Though PMP materials reduce planar coupling because of the attenuating characteristics of the polymer between the rods of the SP materials, generally PZT, it is still not enough in applications that require high lateral and temporal resolution, such as in medical diagnostics and industrial non-destructive testing. The deleterious effects of planar coupling transferred in the Z matching layers are reduced, thus decreasing the signal-to-noise ratio, particularly in multi-element transducer arrays. This invention introduces a Z matching layer that significantly reduces the acoustical crosstalk, besides providing other benefits.

SUMMARY OF THE INVENTION

Briefly, according to this invention, there is provided an impedance matching layer comprising a homogenous matrix material. The preferred thickness of the layer is one fourth of the wavelength at the frequency being transmitted. Embedded in the matrix are the fibers, clusters of fibers, or rods of another material perpendicular to the plane face of the layer as well as that of an adjacent piezoelectric material. The preferred diameter of the fibers, cluster of fibers, or rods is between less than one hundredth of the wavelength to one wavelength of the frequency being transmitted in fibers, cluster of fibers, or rods. The length of the fibers, cluster of fibers, or rods is equal to the thickness of the homogeneous matrix. The homogeneous matrix material can be a dielectric or an electrically conductive material, such as electrically and non-electrically conductive polymers, ceramics, or their combinations. The fibers, cluster of fibers, or rods can be composed of metals, any electrically conductive material, or dielectric materials, such as ceramic or polymer, organic, pulp, paper, wood fibers or rods. The fibers, cluster of fibers, or rods must be exposed at least on the surfaces of the acoustic layer that is in contact with the piezoelectric material. The fiber orientation may be well defined or random and distributed in a homogeneous matrix.

BRIEF DESCRIPTION OF THE DRAWINGS

Further features and other objects and advantages of this invention will become apparent from the following detailed description made with reference to the drawings in which.

DESCRIPTION OF THE PREFERRED EMBODIMENTS

Figure 1:
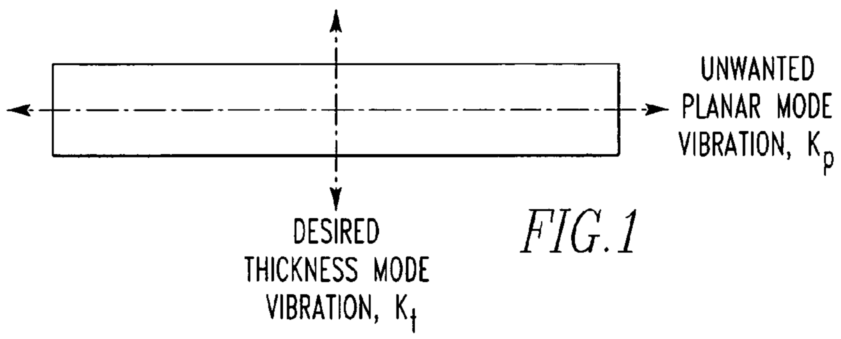
FIG. 1 is a schematic diagram illustrating the modes of vibration generated in a piezoelectric material when it is pulsed with an electrical signal.

When a piezoelectric material, such as a PZT disc, is excited by an electrical pulse, it vibrates in the thickness mode. The frequency of vibration is determined by its thickness. In the majority of ultrasound applications, this is the desired direction of vibration in the medium of ultrasound transmission. Among other characteristics of the PZT material, the magnitude and efficiency of a transducer device is controlled by the electro-mechanical coupling coefficient in the thickness mode, denoted by $k_t$. However, with each electrical pulse applied, the PZT material also vibrates perpendicular to the thickness direction, that is, in the planar mode, denoted by $k_p$ as shown in FIG. 1.

The effects of planar mode vibration $k_p$ are extremely detrimental in the operation of the transducer because vibrations caused by planar coupling are transferred into anything that is in contact with the piezoelectric material. For a simple single element transducer, effects of planar coupling are transferred in the acoustic impedance matching layer, as well as in the housing that contains and supports the piezoelectric material and other materials. In the multi-element transducers, such as linear, matrix, or phased arrays, the effects of planar coupling are transferred to the adjacent transducers. Ultimately, in all cases, the resultant transducer device emits poor quality signals due to low signal-to-noise ratio, subsequently adversely affecting resolution, detectability, and efficiency. In general, the higher the $k_p$, the higher the noise. Therefore, it is necessary to have a material in front and/or back of the piezoelectric material that is characterized by acoustic transparency in the desired vibration direction (thickness mode) and acoustic opacity in the planar direction.

Figure 2:
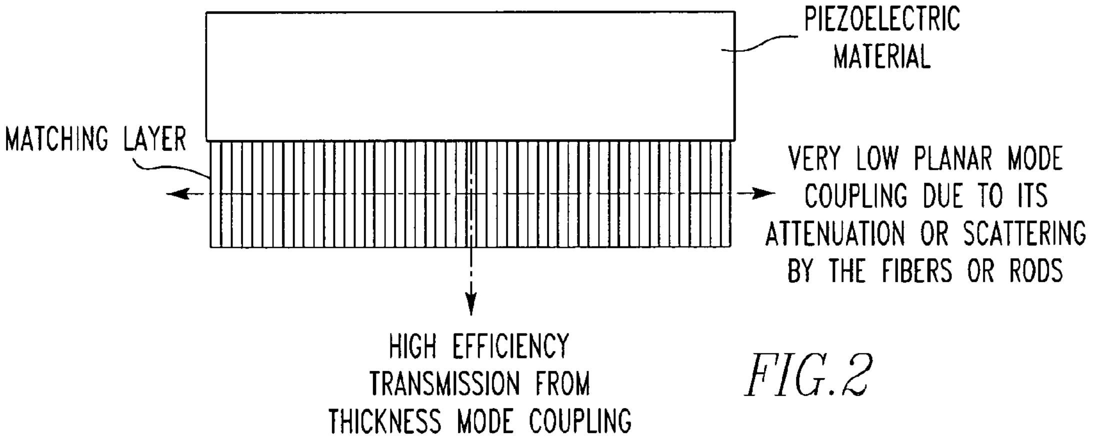
FIG. 2 is a schematic diagram illustrating the effect of a Z matching layer according to this invention on the deleterious effects of planar coupling coefficient of a piezoelectric material.

According to this invention, an anisotropic material is one composed of perpendicularly aligned fibers, cluster of fibers, or rods embedded in an otherwise homogeneous material. Combination of this material with a piezoelectric material is shown in FIG. 2. Used as an acoustic impedance matching layer, it effectively transfers ultrasound in the thickness mode, while it attenuates the deleterious effects of planar mode coupling. The former is the result of very low attenuation of ultrasound, while the latter is the result of extremely high attenuation caused by the scatter of planar mode vibration by the fibers, cluster of fibers, or rods.

Figure 3:
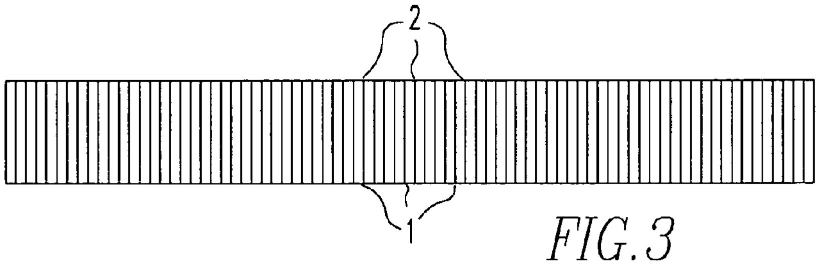
FIG. 3 is a cross-sectional view of the material according to this invention.

Referring to FIG. 3, the solid lines are fibers, cluster of fibers, or rods 1 embedded in a homogeneous medium 2.

Figure 4:
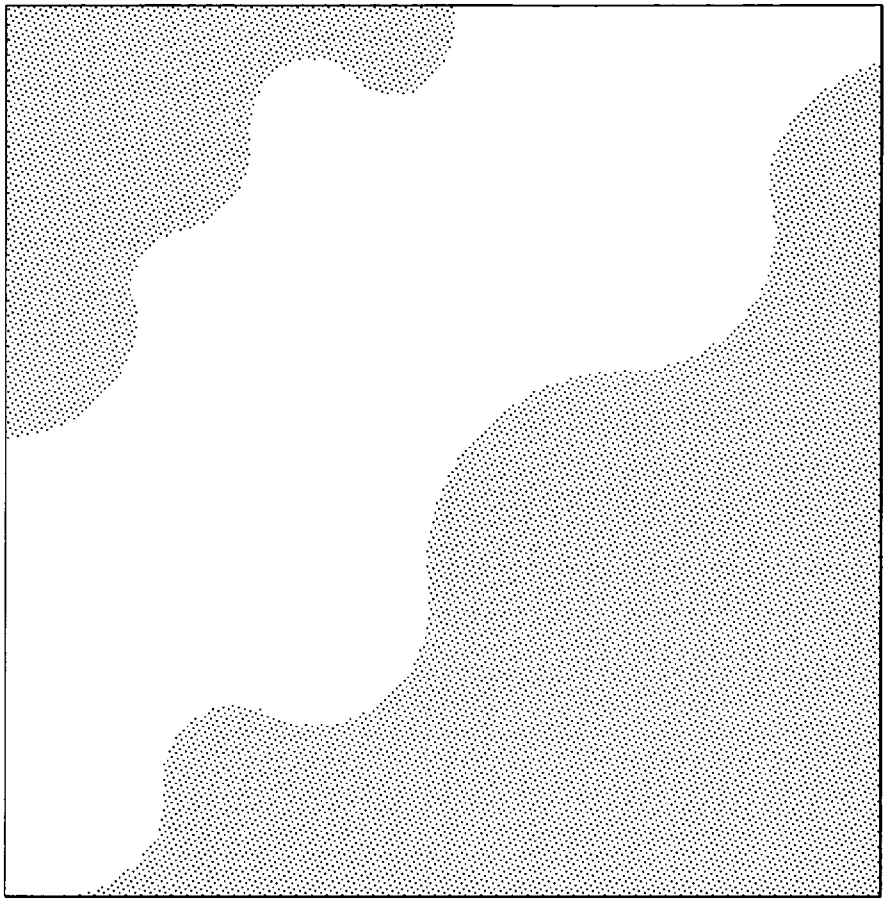
FIG. 4 shows the top or bottom surface of the material according to a preferred embodiment.

As shown in FIGS. 3 and 4, when the fibers, clusters of fibers, or rods are embedded in the matrix of a solid or liquid medium, conductive or non-conductive fibers or rods 1 are embedded in polymer, ceramic, or a composite material, or even in a non-electrically conductive liquid medium 2.

Figure 5:
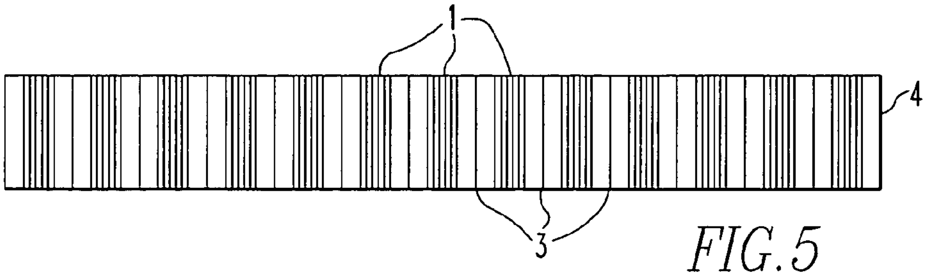
FIG. 5 is a cross-sectional view of the material according to a preferred embodiment.
Figure 6:
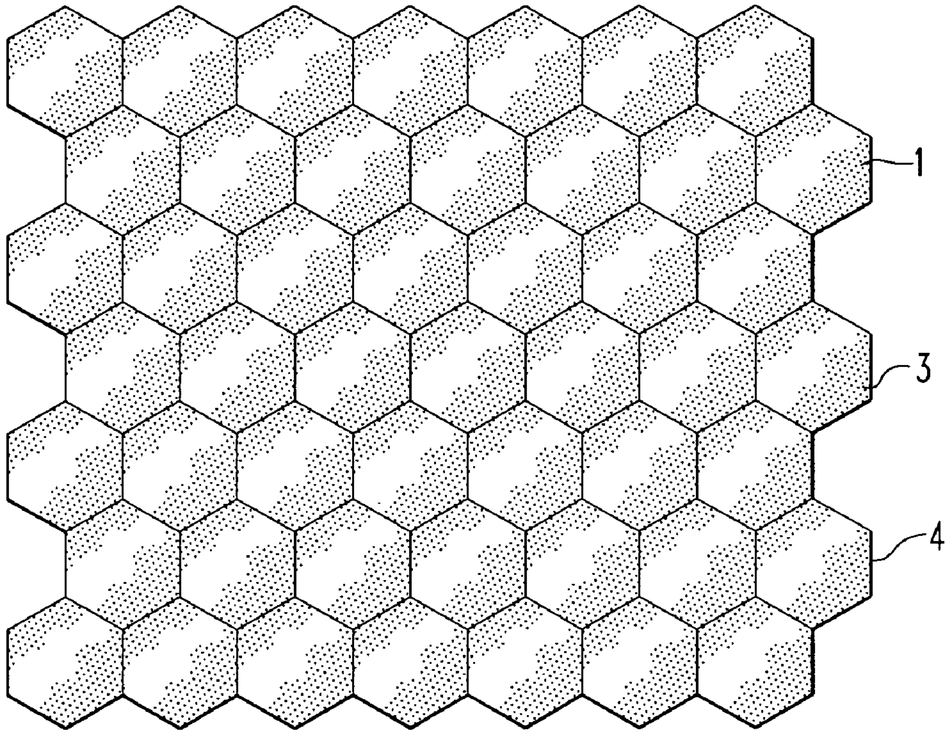
FIG. 6 is a view of a top or bottom surface of the material according to this invention.

As shown in FIG. 5, when fibers, cluster of fibers, or rods are embedded in an essentially gaseous medium, electrically conductive or non-conductive fibers, cluster of fibers, or rods 11 are aligned in the empty (air/gas filled) space 13 of a material with holes, perforations, or cells, that run continuously perpendicular to the thickness of the material 14. As an example, honeycomb material, such as NOMEX, or any other non-electrically conductive material, is suitable. Referring to FIG. 6, the solid dots are the fibers, cluster of fibers, or rods 11 placed in empty space (air/gas) 13 in a perforated or celled material 14.

APPLICATIONS

Figure 7:
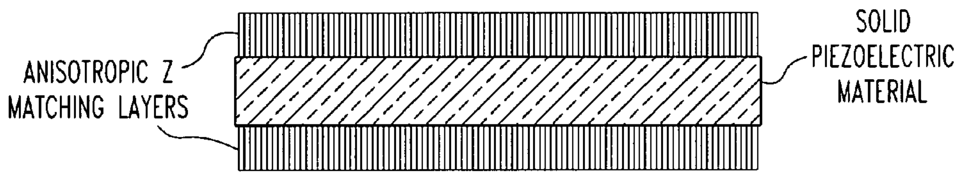
FIG. 7 is a schematic drawing of a single element solid piezoelectric transducer.

FIG. 7 is a cross section of a transducer made by utilizing the material according to this invention with a solid piezoelectric material.

Figure 8:
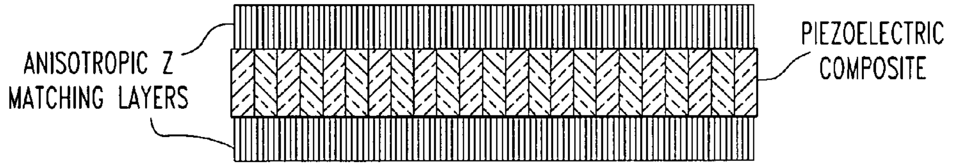
FIG. 8 is a schematic drawing of a single element piezoelectric composite transducer.

Referring to FIG. 8, a transducer comprises the impedance matching material according to this invention with a composite piezoelectric material.

Figure 9:
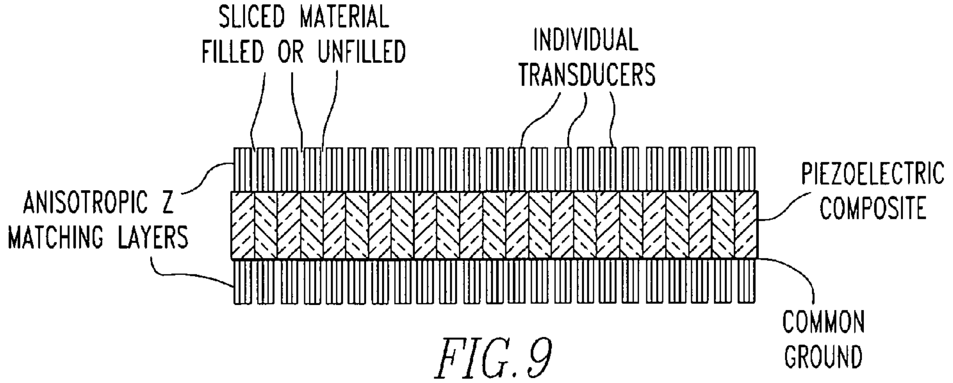
FIG. 9 is a schematic drawing of a multi-element transducer.

Referring to FIG. 9, the bottom side of the piezoelectric material can be bonded with material according to this invention that is filled with electrically conductive or non-conductive fibers, cluster of fibers, or rods in a homogeneous medium. However, on the top side of the piezoelectric material, the fibers, cluster of fibers, or rods must be electrically conductive so that they are electrically connected or bonded with the top surface of the piezoelectric material. After the top Z matching layer has been cut up to the interface between the Z matching layer and the piezoelectric material to produce the desired number of transducers to form linear or matrix arrays, then the fibers, cluster of fibers, or rods within individual transducer sections can be connected with electrical wires.

Having thus described my invention in the detail and particularity required by the Patent Laws, what is desired protected by Letters Patent is set forth in the following claims.

The invention claimed is:

1. An acoustic impedance matching material having a plane face comprising a first homogenous matrix material with embedded fibers, clusters of fibers, or rods of a second material oriented perpendicular to the plane face, wherein the first material is electrically conductive and the second material is also electrically conductive.

2. The acoustic impedance matching material of claim 1 in which the acoustic impedances of the first and second materials are selected to promote sound transfer perpendicular to the plane face and to attenuate sound transfer parallel to the plane face.

3. The acoustic impedance matching material of claim 1 in which the first material is electrically non-conductive and the second material is electrically conductive.

4. A piezoelectric transducer comprising a piezoelectric layer and an adjacent layer of an acoustic impedance matching material having a plane face comprising a homogenous matrix first material with embedded fibers, clusters of fibers, or rods of a second material oriented perpendicular to the plane face, wherein the acoustic impedances of the first and second materials are selected to promote sound transfer perpendicular to the plane face and to attenuate sound transfer parallel to the plane face, and wherein the first material is electrically conductive and the second material is electrically conductive, such that the second material is electrically bonded to the first material.

5. The piezoelectric transducer of claim 4, wherein the fiber orientation is well defined.

6. The piezoelectric transducer of claim 4, wherein fibers are randomly distributed.

* * * * *